United States Patent [19]

Kikuchi et al.

[11] Patent Number: 4,908,692
[45] Date of Patent: Mar. 13, 1990

[54] FUSE-CONTAINING SEMICONDUCTOR DEVICE

[75] Inventors: Kouji Kikuchi, Kawasaki; Kazuo Endo, Yokohama, both of Japan

[73] Assignee: Kabushiki Kaisha Toshiba, Kawasaki, Japan

[21] Appl. No.: 302,142

[22] Filed: Jan. 27, 1989

Related U.S. Application Data

[63] Continuation of Ser. No. 32,527, Apr. 1, 1987, abandoned.

[30] Foreign Application Priority Data

Jun. 20, 1986 [JP] Japan ............................. 61-142679

[51] Int. Cl.⁴ ..................... H01L 29/06; H01L 27/02; H01L 23/48
[52] U.S. Cl. ......................................... 357/51; 357/55; 357/67; 357/71
[58] Field of Search ..................... 357/51, 55, 67, 71

[56] References Cited

U.S. PATENT DOCUMENTS

| 4,198,744 | 4/1980 | Nicolay | 357/51 |
| 4,209,894 | 8/1980 | Keen | 357/51 |
| 4,263,058 | 4/1981 | Brown et al. | 357/71 S |
| 4,339,867 | 7/1982 | Reihl et al. | 357/65 |
| 4,413,272 | 11/1983 | Mochizuki et al. | 357/51 |
| 4,502,200 | 3/1985 | McPherson | 357/46 |
| 4,503,315 | 3/1985 | Kamioka et al. | 357/51 |
| 4,617,723 | 10/1986 | Mukai | 357/51 |
| 4,670,970 | 6/1987 | Bajor | 357/51 |
| 4,679,310 | 7/1987 | Ramachandra et al. | 357/51 |
| 4,682,204 | 7/1987 | Shiozaki et al. | 357/55 |

FOREIGN PATENT DOCUMENTS 60-231350 11/1985 Japan ..................... 357/51

OTHER PUBLICATIONS

S. P. Murarka, "Refractory Silicides for Integrated Circuits", *Journal of Vacuum Science and Technology*, vol. 17 (1980), pp. 775-792.

F. Mohammadi, "Silicides for Interconnection Technology", *Solid State Technology* (Jan. 1981), pp. 65-71.

*Primary Examiner*—J. Carroll
*Attorney, Agent, or Firm*—Finnegan, Henderson, Farabow, Garrett & Dunner

[57] ABSTRACT

A semiconductor device comprises a semiconductor substrate, an insulating layer formed on the substrate, and a fuse deposited on the insulating layer so as to be interposed between two wiring layers. The fuse is prepared from high melting point metal silicide.

8 Claims, 1 Drawing Sheet

- 5: BASE BONDING REGION
- 2: BASE REGION
- 1: Si SUBSTRATE
- 3: EMITTER REGION
- 6: EMITTER ELECTRODE
- 8: EMITTER BONDING REGION

FUSE-CONTAINING SEMICONDUCTOR DEVICE

This application is a continuation of application Ser. No. 032,537, filed Apr. 1, 1987, abandoned.

BACKGROUND OF THE INVENTION

This invention relates to a fuse-containing semiconductor device. Recently it has been common practice to build a fuse into a semiconductor device. This procedure arises from the requirements of writing data in a ROM unit by melting away the fuse; or protecting the predetermined element or elements involved in a semiconductor device, or exchanging spare bits provided in a RAM unit. The sectional view of FIG. 2 illustrates the arrangement of a fuse built in the above-mentioned type of semiconductor device. Referring to FIG. 2, insulating layer 4 is deposited on a silicon semiconductor substrate 1. Further, fuse 7 is mounted on the insulating layer 4. Fuse 7 is connected to first wiring 6 at one end, and to second wiring 8 at the other end.

Since fuse 7 has a relatively high resistance of about 10 $\Omega$, the customary practice is to provide a thin polycrystalline silicon layer adjusted to have a sheet resistance of about 40 $\Omega/\square$ by impurity doping and trimming the thin polycrystalline layer so as to let it have a width of 10 microns and a length of about 3 microns (Japanese patent disclosure Sho No. 59-130441). Fuse 7 is prepared from a thin aluminium film, which is deposited on insulating layer 4. The aluminium layer is irradiated by laser beams in order to be converted into $Al_2O_3$, thereby controlling the sheet resistance to a predetermined level (Japanese patent disclosure Sho No. 60-84835).

Since, in recent years, semiconductor elements involved in a semiconductor device have been progressively miniaturized, fusion current has also decreased in magnitude. Consequently, the fuse built in a semiconductor device must have the following features: fuse resistance below 5 $\Omega$; fusion current of a lower magnitude than 0.5 A, and fusion completed within 30 seconds.

However, the conventional fuse prepared from polycrystalline silicon presents difficulties in realizing a low resistance of less than 5 $\Omega/\square$. Even if such a low resistance could be attained, the problem arose that the aluminium component of the aluminium electrode connected to the fuse tended to diffuse into the polycrystalline silicon constituting the fuse, thus undesirably giving rise to changes in the properties of the fuse, such as its electric resistance and fusion feature. An aluminum fuse can indeed have its resistance easily reduced to a lower level than 5 $\Omega$. However, the fusion current, if set at a lower level than 0.5 A, will become extremely unstable. Namely, some fuses melt within 30 seconds, while other fuses consume 90 seconds in completing melting.

SUMMARY OF THE INVENTION

This invention has been accomplished in view of the above-mentioned circumstances and is intended to provide a semiconductor device containing a fuse which has a low resistance and can melt away with a predetermined low current within a specified period of time.

To attain the above-mentioned object, this invention provides a semiconductor device comprising a semiconductor substrate an insulating layer provided on the semiconductor substrate, and a fuse provided on the insulating layer so as to be connected in series between two wiring layers, wherein the fuse includes a thin high melting point metal silicide layer.

The present invention can resolve the difficulties accompanying the conventional fuse-containing semiconductor device where the length of time required for the melting of the conventional aluminium fuse is unstable. The invention is characterized in that a fuse is prepared from a high melting point metal silicide with attention drawn to the fact that the unstable fusion time arises from a large temperature coefficient of resistivity and low melting point of aluminium.

A high melting point metal silicide contained in the fuse of the present invention is selected from the group consisting of, for example, $MoSi_x$, $WSi_x$, $TiSi_x$, etc. A sheet prepared from $MoSi_x$ with a thickness of, for example, 3000 Å has a resistance of about 4 $\Omega/\square$. Now let it be assumed that the ratio between the effective length L of a fuse and its width W is 1. Then the resistance of the fuse stands at 4 $\Omega$, making it possible to easily realize a fuse having a lower resistance than 5 $\Omega$. Particularly where it is required to reduce fuse resistivity to a level lower than prescribed above, it is advised to prepare a fuse from a composite layer consisting of at least one high melting point metal silicide and another similar high melting point metal.

DETAILED DESCRIPTION OF THE PREFERRED EMBODIMENTS

Figure 1:
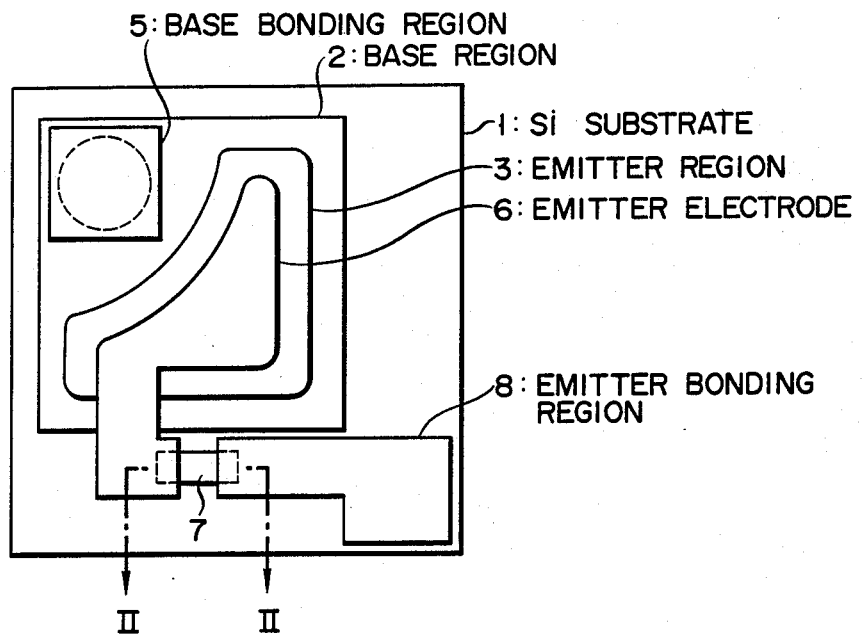
FIG. 1 is a plan view of a semiconductor device according to a first embodiment of this invention.
Figure 2:
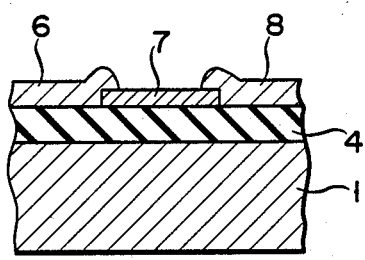
FIG. 2 is a sectional view on line II—II of FIG. 1.

Referring to FIG. 1, silicon semiconductor substrate 1 concurrently acts as the collector region of a bipolar transistor. Base region 2 is formed in collector region 1. Emitter region 3 is provided in base region 2. In FIG. 2, $SiO_2$ layer 4 deposited on the surface of semiconductor substrate 1 acts as an insulating layer. Reference numeral 5 given in FIG. 1 represents an aluminium base bonding region contacting part of base region 2 through a contact hole bored in insulating layer 4. Reference numeral 6 in FIG. 1 shows an aluminium emitter electrode contacting emitter region 3 shown through a contact hole bored in insulating layer 4. Reference numeral 8 denotes an emitter bonding region mounted on insulating layer 4. The left side end of fuse 7 (as shown in FIG. 2) is connected to the right side end of one wiring of emitter electrode 6. The right side end of fuse 7 is connected to the left side end of the other wiring of emitter bonding region 8.

In the embodiment of the present invention, fuse 7 was prepared by sputtering Si and high melting point metal, for example, Mo at the same time on insulating layer 4. However, fuse 7 may be provided by sputtering high melting point metal silicide. The sputtering may be replaced by thermal deposition or chemical vapor deposition (CVD).

Referring to FIG. 1, a Mo silicide layer having a thickness of 3000 Å was deposited on the insulating layer and the layer was patterned to provide fuse 7, 10 microns in width and 9 microns in length. The end portions of wirings 6 and 8 were overlapped on both end portions of fuse 7 respectively, thereby providing fuse 7, measuring 10 microns in effective width and 3 microns in effective length. Fuse 7 thus formed indicated a resistance of 4 Ω, which showed extremely minute variations.

Figure 3:
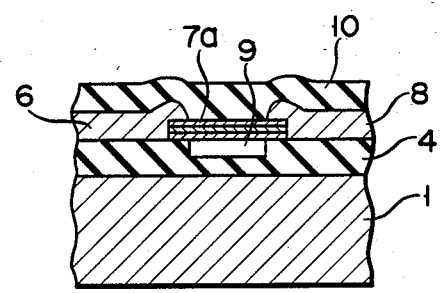
FIG. 3 is a sectional view of a semiconductor device according to a second embodiment of the invention (corresponding to FIG. 2)

FIG. 3 is a sectional view of a fuse according to a second embodiment of this invention. This fuse is prepared through the following steps. First, groove measuring 15 microns in width, about 3 microns in length and 1.5 microns in depth is formed in $SiO_2$ layer 4. Resist material is fitted in groove 9. Fuse 7a is deposited on the insulating layer including groove 9. Later, the resist material fitted in groove 9 is removed to provide an air space immediately below fuse 7a. Later, as shown in FIG. 3, wirings 6 and 8 are made to overlap both end portions of fuse 7a. This fuse 7a is a composite body consisting of a first layer of $MoSi_x$ deposited on insulating layer 4 with a thickness of 1000 Å, a second layer of Mo mounted on the first layer with a thickness of 2000 Å and a third layer of $MoSi_x$ formed on the second layer with a thickness of 1000 Å. Composite fuse 7a indicated a resistance of 0.8 Ω. Air space 9 offers the advantage of preventing fuse 7a from being rendered electrically conductive a second time while it is melted away, and enabling fusion to be brought to an end in the predetermined length of time. Reference numeral 10 represents a passivation layer covering wirings 6 and 8 and fuse 7a.

Figure 4:
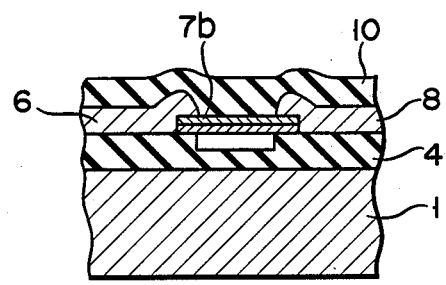
FIG. 4 is a sectional view of a semiconductor device according to a third embodiment of the invention (corresponding to FIG. 2).

Description may now be made of a fuse-containing semiconductor device according to a third embodiment of the invention with reference to FIG. 4, showing the sectional view of the fuse member.

The fuse member 7b of FIG. 4 is substantially the same as that of FIG. 3, except that it is a composite body consisting of a first layer of $MoSi_x$ deposited on insulating layer 4, and a second layer of Mo mounted on the first layer.

The present invention offers the advantages that it is possible to easily fabricate a fuse having a resistance lower than 5 Ω, which has hitherto been prepared from polycrystalline silicon with tremendous difficulties, and the attainment of fusion with a fusion current of 0.5 Å, which the conventional aluminium fuse could not easily realize, can be carried out within 30 seconds.

The foregoing embodiment referred to the case where a high melting point metal silicide was represented by $MoSi_x$. However, the application of $WSi_x$ or $TiSi_x$ attained the same result as described in the aforesaid embodiment.

What is claimed is:

1. A semiconductor device having a fuse, which device comprises:
   a semiconductor substrate;
   an insulating layer provided on said semiconductor substrate;
   at least two wiring layers separately formed on said insulating layer; and
   a fuse provided on said insulating layer for connecting the two wiring layers;
   wherein said fuse includes a composite body formed of a first layer of a metal silicide including a metal component, and a second layer prepared from metal material corresponding to the metal component and provided on said first layer.

2. The semiconductor device according to claim 1, wherein a third layer of said metal silicide is provided on said second layer.

3. The semiconductor device according to claim 1, wherein said insulating layer has a groove forming a cavity immediately beneath said fuse.

4. The semiconductor device according to claim 1, wherein said first layer is formed of $MoSi_x$ or $WSi_x$ or $TiSi_x$.

5. The semiconductor device according to claim 1, wherein said second layer is formed of Mo.

6. The semiconductor device according to claim 1, wherein said first layer is formed of $MoSi_x$ or $WSi_x$ or $TiSi_x$, and said second layer is formed of Mo.

7. The semiconductor device according to claim 2, wherein said third layer is formed of $MoSi_x$ or $WSi_x$ or $TiSi_x$.

8. The semiconductor device according to claim 7, wherein said insulating layer is formed of $SiO_x$.

* * * * *